(12) United States Patent
Araki

(10) Patent No.: US 12,065,760 B2
(45) Date of Patent: Aug. 20, 2024

(54) METHOD OF MANUFACTURING SEMICONDUCTOR ELEMENT, SEMICONDUCTOR ELEMENT, AND SUBSTRATE

(71) Applicant: KYOCERA Corporation, Kyoto (JP)

(72) Inventor: Masahiro Araki, Kyoto (JP)

(73) Assignee: Kyocera Corporation, Kyoto (JP)

(*) Notice: Subject to any disclaimer, the term of this patent is extended or adjusted under 35 U.S.C. 154(b) by 517 days.

(21) Appl. No.: 17/418,359

(22) PCT Filed: Dec. 25, 2019

(86) PCT No.: PCT/JP2019/050984
§ 371 (c)(1),
(2) Date: Jun. 25, 2021

(87) PCT Pub. No.: WO2020/138226
PCT Pub. Date: Jul. 2, 2020

(65) Prior Publication Data
US 2022/0064818 A1    Mar. 3, 2022

(30) Foreign Application Priority Data
Dec. 26, 2018   (JP) .................................. 2018-243582

(51) Int. Cl.
*C30B 25/04* (2006.01)
*C30B 29/40* (2006.01)
*H01L 21/02* (2006.01)

(52) U.S. Cl.
CPC ............ *C30B 29/406* (2013.01); *C30B 25/04* (2013.01); *H01L 21/02389* (2013.01);
(Continued)

(58) Field of Classification Search
CPC .............. C30B 24/04; H01L 21/02639; H01L 21/02518–02568;
(Continued)

(56) References Cited

U.S. PATENT DOCUMENTS 5,217,564 A * 6/1993 Bozler ................ H01L 31/0687
438/492
2003/0232457 A1   12/2003 Kawaguchi et al.
(Continued)

FOREIGN PATENT DOCUMENTS

JP          5023318 B2      9/2012
JP       2013-251304 A     12/2013
(Continued)

*Primary Examiner* — Laura M Menz
*Assistant Examiner* — Candice Chan
(74) *Attorney, Agent, or Firm* — Procopio, Cory, Hargreaves & Savitch LLP

(57) ABSTRACT

A method of manufacturing a semiconductor element according to the present disclosure includes a mask forming step of defining, on a first surface of a substrate, a front surface region not covered by a first deposition inhibiting mask as a first crystal growth region, an element forming step of forming a semiconductor layer over the first crystal growth region, a mask removing step of removing the mask, and an element separating step of separating the semiconductor layer. After the element separating step, a substrate reusing process is performed one or more times, the substrate reusing process including a mask reforming step of forming a second deposition inhibiting mask in a region differing from a formation position of the first deposition inhibiting mask to expose a second crystal growth region not covered by the mask, an element reforming step of forming a semiconductor layer to serve as an element on the second crystal growth region, a mask removing step of removing the (Continued)

deposition inhibiting mask, and an element separating step of separating the semiconductor layer from the substrate.

15 Claims, 15 Drawing Sheets

(52) U.S. Cl.
CPC ...... *H01L 21/0254* (2013.01); *H01L 21/0262* (2013.01); *H01L 21/02639* (2013.01); *H01L 21/02647* (2013.01)

(58) Field of Classification Search
CPC ....... H01L 21/02595–02598; H01L 21/02032; H01L 21/02636–02642
See application file for complete search history.

(56) References Cited

U.S. PATENT DOCUMENTS

| | | | |
|---|---|---|---|
| 2009/0085165 A1 | 4/2009 | Hiramatsu et al. | |
| 2019/0237324 A1* | 8/2019 | Araki | C30B 29/403 |
| 2020/0219983 A1 | 7/2020 | Fujikura | |

FOREIGN PATENT DOCUMENTS

| | | |
|---|---|---|
| WO | 2003/063215 A1 | 7/2003 |
| WO | 2018/230150 A1 | 12/2018 |

* cited by examiner

METHOD OF MANUFACTURING SEMICONDUCTOR ELEMENT, SEMICONDUCTOR ELEMENT, AND SUBSTRATE

TECHNICAL FIELD

The present disclosure relates to a method of manufacturing a semiconductor element, a semiconductor element obtained thereby, and a substrate used in manufacturing the semiconductor element.

BACKGROUND ART

One known method of manufacturing a semiconductor element is to manufacture the semiconductor element by crystal-growing a semiconductor layer on a substrate and then separating the semiconductor layer from the substrate (for example, see Patent Document 1).

CITATION LIST

Patent Literature

Patent Document 1: JP 5023318 B

SUMMARY

A method of manufacturing a semiconductor element according to the present disclosure includes: a mask forming step of forming, on a first surface of a substrate, a first deposition inhibiting mask configured to inhibit growth of semiconductor crystals in a predetermined pattern to define a front surface region not covered by the first deposition inhibiting mask as a first crystal growth region, the first surface serving as a starting point of growth of the semiconductor crystals, an element forming step of growing semiconductor crystals by vapor-phase growth from the first crystal growth region over the first deposition inhibiting mask to form a semiconductor layer to serve as an element, a mask removing step of removing the first deposition inhibiting mask, and an element separating step of separating the semiconductor layer from the substrate.

After the element separating step, a substrate reusing process of using the substrate after separating the semiconductor layer is performed one or more times, the substrate reusing process including: a mask reforming step of forming a second deposition inhibiting mask in a region including the first crystal growth region and differing from a formation position of the first deposition inhibiting mask formed in the mask forming step to expose a second crystal growth region not covered by the second deposition inhibiting mask, an element reforming step of growing semiconductor crystals by vapor-phase growth from the second crystal growth region over the second deposition inhibiting mask adjacent to the second crystal growth region to again form a semiconductor layer to serve as an element, a mask removing step of removing the second deposition inhibiting mask, and an element separating step of separating the semiconductor layer that is formed from the substrate.

Further, a semiconductor element according to the present disclosure is a semiconductor element obtained by the above method of manufacturing. The semiconductor element is formed on a substrate by crystal growth and separated from the substrate, and includes a step portion where unevenness of the substrate front surface is reversely transferred, on a surface opposing the substrate prior to separation.

Further, a substrate of the present disclosure is a substrate used in the above method of manufacturing a semiconductor element, and includes a first surface serving as a starting point of growth of semiconductor crystals and a protective layer provided on a second surface located on a side opposite to the first surface.

DESCRIPTION OF EMBODIMENTS

The objects, features, and advantages of the present disclosure will become more apparent from the following detailed description and drawings.

Embodiments of the present disclosure will be described below with reference to the drawings. The drawings are schematic illustrations, where the thickness of each layer (film), element and substrate in each drawing is emphasized for ease of explanation.

First, a method of manufacturing a semiconductor element in a configuration based on a method of manufacturing a semiconductor element according to the present disclosure will be described.

As a method of manufacturing a semiconductor element in a configuration based on the method of manufacturing a semiconductor element according to the present disclosure, one method is known of manufacturing the semiconductor element by crystal-growing a semiconductor layer on a substrate and then separating the semiconductor layer from the substrate.

A method of reusing a substrate (a recycling process) in which a semiconductor layer is crystal-grown again on a used substrate after a semiconductor layer (semiconductor element) has been separated has also been disclosed.

A method of manufacturing a semiconductor element according to an embodiment includes the processes (also referred to as steps) illustrated in FIGS. 1A to 1D corresponding to manufacturing of a first time in which manufacturing is performed for the first time, and one or more substrate reusing processes in which the steps illustrated in FIGS. 2A to 2D are repeatedly looped.

Figure 1A:
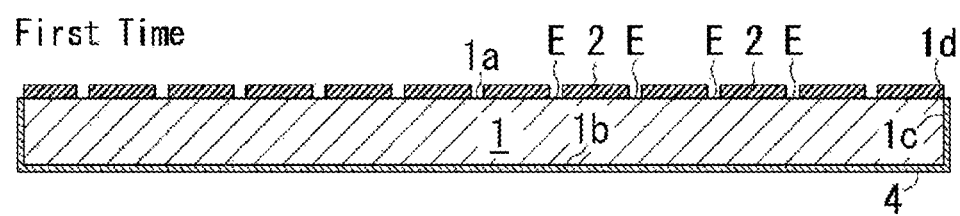
FIG. 1A is a diagram illustrating a process of manufacturing of a first time using a substrate in an initial state in a method of manufacturing a semiconductor element according to an embodiment.
Figure 1B:
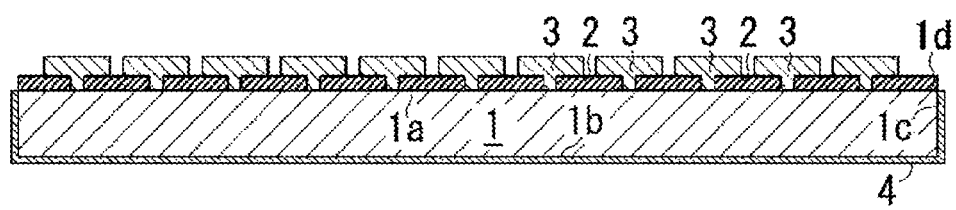
FIG. 1B is a diagram illustrating the process of manufacturing of the first time using a substrate in an initial state in the method of manufacturing a semiconductor element according to the embodiment.
Figure 1C:
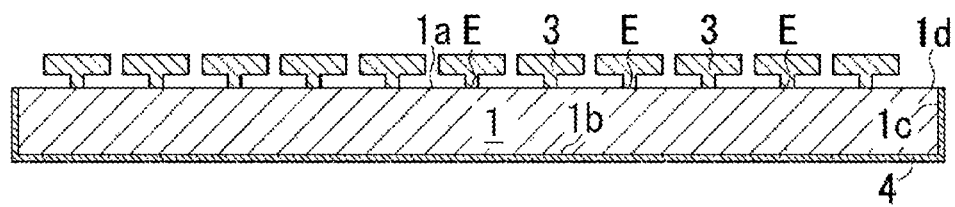
FIG. 1C is a diagram illustrating the process of manufacturing of the first time using a substrate in an initial state in the method of manufacturing a semiconductor element according to the embodiment.
Figure 1D:
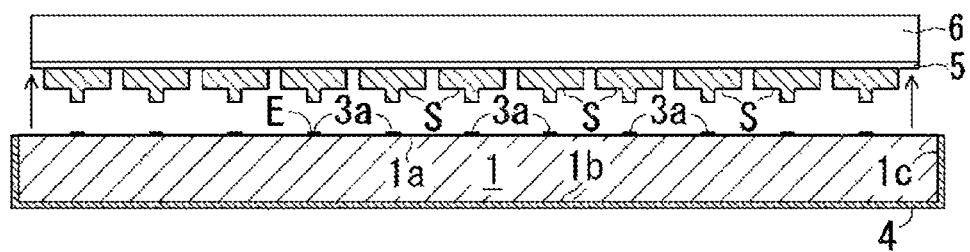
FIG. 1D is a diagram illustrating the process of manufacturing of the first time using a substrate in an initial state in the method of manufacturing a semiconductor element according to the embodiment.
Figure 2A:
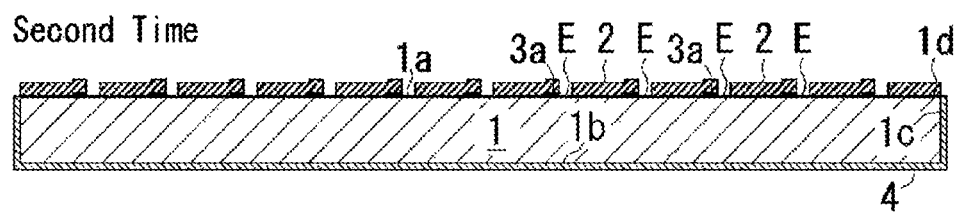
FIG. 2A is a diagram illustrating a process of manufacturing of a second time using a recycled substrate.
Figure 2B:
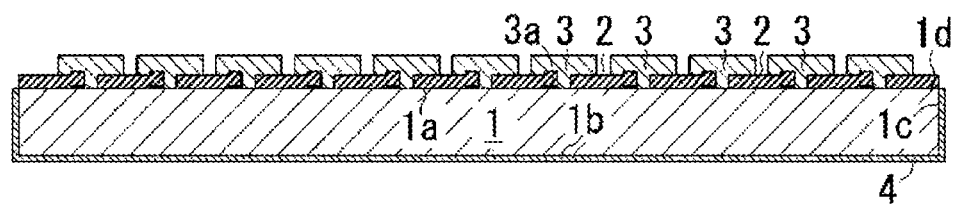
FIG. 2B is a diagram illustrating the process of manufacturing of the second time using the recycled substrate.
Figure 2C:
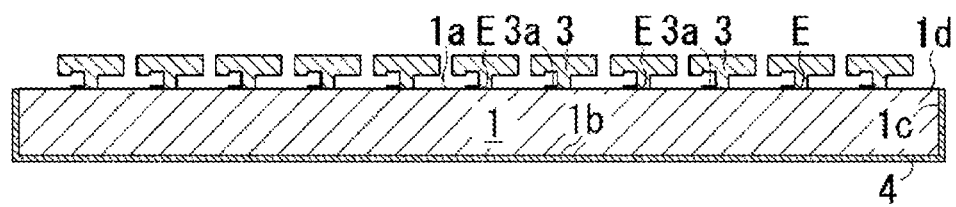
FIG. 2C is a diagram illustrating the process of manufacturing of the second time using the recycled substrate.
Figure 2D:
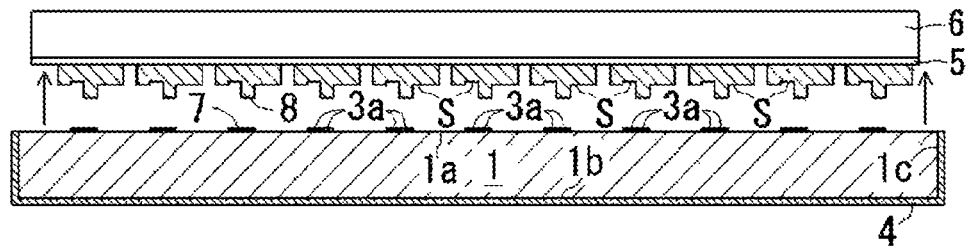
FIG. 2D is a diagram illustrating the process of manufacturing of the second time using the recycled substrate.
Figure 3A:
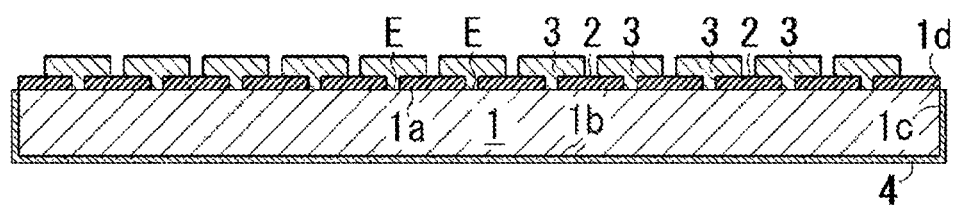
FIG. 3A is a diagram illustrating a configuration post formation of a semiconductor layer in a case where manufacture of a semiconductor element according to an embodiment is repeated multiple times, and illustrates a state after an element forming step of a first time.
Figure 3B:
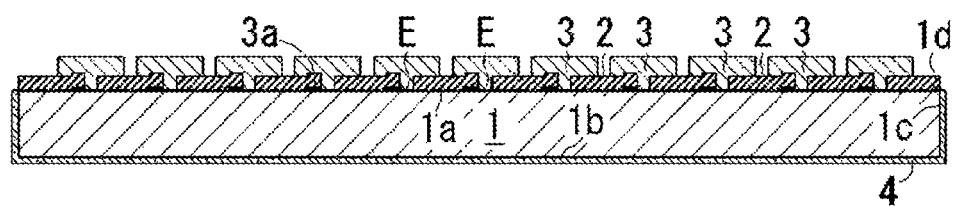
FIG. 3B is a diagram illustrating a configuration post formation of a semiconductor layer in a case where manufacture of a semiconductor element according to an embodiment is repeated multiple times, and illustrates a state after an element forming step of a second time.
Figure 3C:
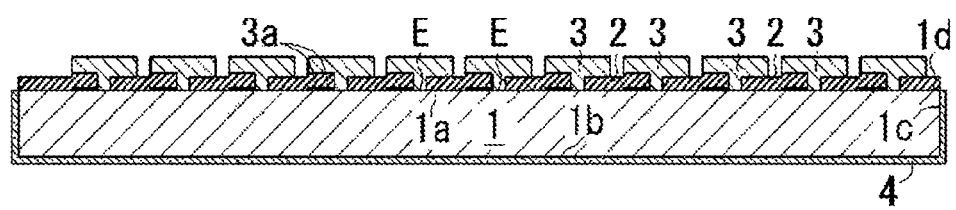
FIG. 3C is a diagram illustrating a configuration post formation of a semiconductor layer in a case where manufacture of a semiconductor element according to an embodiment is repeated multiple times, and illustrates a state after an element forming step of a third time. It is a diagram.
Figure 3D:
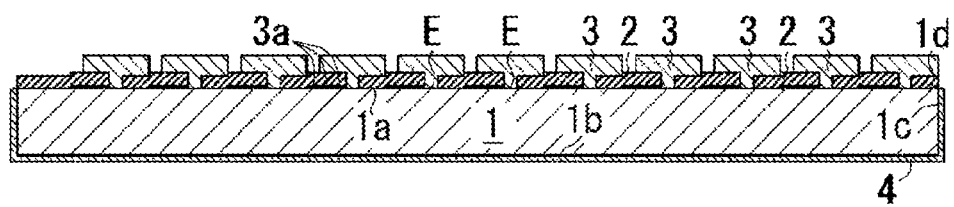
FIG. 3D is a diagram illustrating a configuration post formation of a semiconductor layer in a case where manufacture of a semiconductor element according to an embodiment is repeated multiple times, and is a diagram illustrating a state after an element forming step of a fourth time.
Figure 3E:
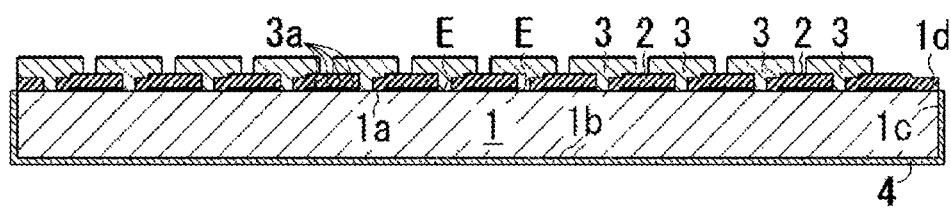
FIG. 3E is a diagram illustrating a configuration post formation of a semiconductor layer in a case where manufacture of a semiconductor element according to an embodiment is repeated multiple times, and is a diagram illustrating a state after an element forming step of a fifth time.
Figure 3F:
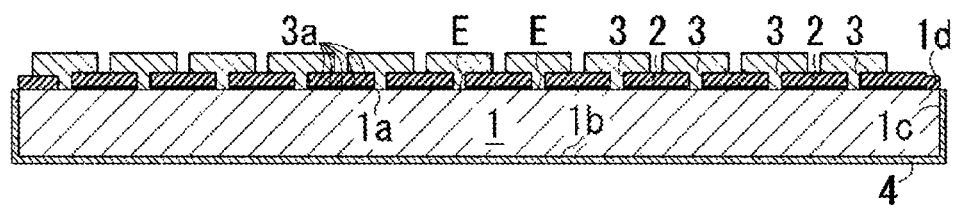
FIG. 3F is a diagram illustrating a configuration post formation of a semiconductor layer in a case where manufacture of a semiconductor element according to an embodiment is repeated multiple times, and is a diagram illustrating a state after an element forming step of a sixth time.

FIG. 1A illustrates a mask forming step of a first time, and FIG. 2A illustrates a mask reforming step of a second time (the substrate reusing process). Similarly, FIG. 1B illustrates an element forming step of the first time, FIG. 2B illustrates an element reforming step of the second time (substrate reusing process), FIG. 1C illustrates a mask removing step of the first time, FIG. 2C illustrates a mask removing step of the second time (substrate reusing process), FIG. 1D illustrates an element separating step of the first time, and FIG. 2D illustrates an element separating step of the second time (substrate reusing process).

In the embodiment, the aforementioned substrate reusing process is performed five times. Combined with the manufacturing of the first time, semiconductor element manufacturing is performed a total of six times using a substrate 1, which is the same substrate for all processes. FIG. 3A, FIG. 3B, FIG. 3C, FIG. 3D, FIG. 3E, and FIG. 3F illustrate part of the element forming process and element forming steps from a first time to a sixth time among all the six repeated processes (steps) in order of the number of repetitions.

The substrate 1, which is used in common for each process and each step, includes a flat first surface 1a on a "front surface" serving as a main surface. The first surface 1a is the starting point of growth of the semiconductor crystals. At least the front surface of the first surface 1a is covered by a nitride semiconductor. The substrate 1 used in the embodiment is, for example, a gallium nitride (GaN) substrate cut out from a GaN single crystal ingot.

The GaN substrate may be an n-type substrate or a p-type substrate in which impurities are doped in the semiconductor. A substrate having an impurity density approximately equal to or less than $1 \times 10^{19}$ cm$^{-3}$ can be used. In addition to a GaN substrate, a substrate other than GaN, such as a sapphire substrate or a SiC substrate, having a GaN layer formed on a front surface of the substrate may be used as the substrate 1.

The front surface of the substrate 1 is not limited to a GaN layer, and any substrate can be used provided that the substrate is composed of a nitride semiconductor. Here, "nitride semiconductor" refers to a semiconductor material constituted by, for example, $Al_xGa_yIn_zN$ ($0 \leq x \leq 1$; $0 \leq y \leq 1$; $0 \leq z \leq 1$; $x+y+z=1$).

In addition, a flat back surface (a second surface 1b) located on a side (lower side) opposite to the first surface 1a (the front surface) and a substrate end surface (side surface) 1c of the substrate 1, excluding the first surface 1a serving as a starting point of growth of the semiconductor crystals may be formed with a protective layer 4 (in this example, a layer containing aluminum oxide, alumina, or the like) that acts to mitigate alteration of the substrate 1 and decomposition of the nitride semiconductor in the processes and steps described below. Although the protective layer 4 need not be formed on the substrate end surface 1c, the protective layer 4 may be formed on the substrate end surface 1c because the substrate 1 is more protected when a protective layer is also present on the substrate end surface 1c. However, the protective layer 4 need not be provided in cases where alteration of the substrate 1 itself is less likely.

In a configuration where the protective layer 4 is not present, the back surface of the substrate 1 gradually pyrolyzes and becomes susceptible to alteration. As a result, the thermal emissivity of the back surface of the substrate 1 and the generated in-plane distribution of thermal emissivity causes growth conditions of the semiconductor crystals to be prone to deviating from optimal conditions and decreases mass productivity. As in the present embodiment, by positioning the protective layer 4 on the back surface of the substrate 1, alteration of the back surface of the substrate 1 can be suppressed, and the growth conditions of the semiconductor crystals can be stabilized to maintain mass productivity.

The method of manufacturing a semiconductor element of a first time using the substrate 1 described above corresponds to the steps in FIGS. 1A to 1D, and includes a mask forming step (FIG. 1A) of forming a first deposition inhibiting mask 2 on the first surface 1a of the substrate 1, an element forming step (FIG. 1B) of forming the semiconductor layer 3 on the first surface 1a of the masked substrate 1, a mask removing step of removing the first deposition inhibiting mask 2 by etching, and an element separating step of separating the semiconductor layer 3 from the first surface 1a of the substrate 1.

Mask Forming Step (First Time)

In the mask forming step, the first deposition inhibiting mask 2 that inhibits growth of semiconductor crystals (semiconductor layer 3) is formed in a predetermined pattern on the first surface 1a of the substrate 1 (GaN substrate).

s a specific example, an $SiO_2$ layer having a thickness from approximately 100 nm to approximately 500 nm is formed as the first deposition inhibiting mask 2. The $SiO_2$ layer is formed by first layering a silicon dioxide ($SiO_2$), which is the material of the first deposition inhibiting mask 2, on the first surface 1a to approximately from 100 nm to 500 nm by using a plasma chemical vapor deposition (PCVD) method.

Subsequently, unnecessary sites in the $SiO_2$ layer are removed by photolithography and hydrofluoric acid (HF)-based wet etching, or by dry etching using a fluorine-based gas such as $CF_4$. As a result, a $SiO_2$ layer with a predetermined pattern can be formed as the first deposition inhibiting mask 2.

An exposed surface E located between adjacent masks 2 and exposed from a strip-shaped groove (upward opening) is a first crystal growth region in which the first surface 1a described above is exposed and a region serving as a starting point of growth of the semiconductor crystals in the element forming step (FIG. 1B) to be described later.

The opening width or groove width, which is the width of the exposed surface E in the parallel direction (the left-right direction illustrated in the drawings) is, for example, from 2 μm to 20 μm. In addition, in the embodiment, the width of the first deposition inhibiting mask 2 in the parallel direction is set to, for example, a range from 150 μm to 200 μm.

The relationship between the width of the first deposition inhibiting mask 2 in the parallel direction and the width of the exposed surface E in the parallel direction is preferably set in consideration of the ratio of the crystal growth rate in a direction perpendicular to the front surface (first surface 1a) of the substrate 1 to the crystal growth rate in a direction parallel to the front surface of the substrate 1 of the semiconductor layer 3 formed in the element forming step (FIG. 1B) subsequently performed, and the thickness of the semiconductor layer 3 to be grown.

The mask pattern of the first deposition inhibiting mask 2 may have a band shape or a stripe shape, or may have a lattice shape in which a plurality of band-shaped bodies are arranged orthogonal to the vertical and horizontal directions. Any pattern may be used as long as the pattern is a so-called repeat design (pattern) in which openings partitioned at a constant spacing (repeat pitch) are repeated multiple times.

Furthermore, an edge portion region near the end face 1c of the substrate 1 on the first surface 1a of the substrate 1 is also covered by the first deposition inhibiting mask 2 described above in consideration of ease of peeling and separating the semiconductor layer 3, which will be described below. As a result, the semiconductor layer 3 near the edge portion located at the edge of the substrate 1 can be cleanly and reliably peeled off.

The mask material constituting the first deposition inhibiting mask 2 is, for example, a material containing a silicon oxide such as $SiO_2$. The first deposition inhibiting mask 2 is preferably made of a material in which the semiconductor layer does not grow starting from the front surface of the mask material by vapor-phase growth. In addition to the material containing a silicon oxide, an oxide such as a zirconium oxide ($ZrO_x$), a titanium oxide ($TiO_x$), or an aluminum oxide ($AlO_x$) can be used. Alternatively, a transition metal such as chromium (Cr) and tungsten (W), molybdenum (Mo), tantalum (Ta), and niobium (Nb) may be used. As the method of layering the mask material, any method suited to the mask material, such as vapor deposition, sputtering, or coating and curing can be used as appropriate.

Element Forming Step (First Time)

In the element forming step, semiconductor crystals are grown so as to spread from the exposed surface E, which is the first crystal growth region, over the adjacent first deposition inhibiting mask 2 to form the semiconductor layer 3 serving as an element. In the present embodiment, the semiconductor layer 3 is a nitride semiconductor, and the nitride semiconductor is grown, by vapor-phase growth (epitaxial growth), from the first surface 1a beyond upper edge openings of the grooves of the first deposition inhibiting mask 2 and over the first deposition inhibiting mask 3.

As specific examples, in the element forming step, a vapor-phase growth method such as a hydride vapor phase epitaxy (HVPE) method using a chloride as a group III (group 13 element) raw material, a metal organic chemical vapor deposition (MOCVD) method using an organic metal as a group III raw material, or a molecular beam epitaxy (MBE) method can be used.

For example, when a GaN layer as the semiconductor layer 3 is grown by MOCVD, first, the substrate 1 patterned with the first deposition inhibiting mask 2 is inserted into a reaction chamber of an epitaxial device and heated while the chamber is supplied with hydrogen gas, nitrogen gas, or a mixed gas of hydrogen and nitrogen and a group V raw material (containing a group 15 element) gas such as ammonia. Then, the temperature inside the chamber is increased to a predetermined growth temperature (e.g., from 1050° C. to 1100° C.).

Then, once the temperature of the substrate 1 is stable, a group III (containing a group 13 element) raw material such as trimethylgallium (TMG) is supplied in addition to the gas described above to induce vapor-phase growth of the semiconductor layer 3 from the exposed surface E (crystal growth region).

At this time, a GaN layer of a desired conductivity type can be obtained by supplying a raw material gas containing an n-type impurity such as Si or a p-type impurity such as Mg. Further, the supply of the raw material is temporarily stopped before the growth crystals exceed the upper edge openings of the grooves or fills the grooves between the first deposition inhibiting masks 2 to stop the growth of the semiconductor crystals, and a "frangible portion" that facilitates peeling of the semiconductor layer 3 described below may be formed as a partial layer (film) before supply of the raw material is restarted.

As an example of the frangible portion (layer), in a case where the GaN layer is crystal-grown, for example, a layer made from a mixed crystal of GaN and BN, AlN, InN or the like may be formed as the frangible portion between an upper semiconductor layer 3 on an opening side and a lower semiconductor layer 3 on the exposed surface E side in the aforementioned groove.

Alternatively, the frangible portion may be formed as a semiconductor layer made from $Al_xGa_yIn_zN$ ($0 \leq x \leq 1$; $0 \leq y \leq 1$; $0 \leq z \leq 1$; $x+y+z=1$) having a lattice constant different from that of the crystal growth layer. Further, a frangible portion having a superlattice structure may be formed by alternately layering AlGaN layers and GaN layers. The frangible portion may be formed by alternately layering layers having a large GaN crystal grain size and layers having a small crystal grain size by varying periodically the crystal growth conditions, or by forming layers with different impurity concentrations by varying the concentration of silicon (Si) used as an N-type impurity of GaN.

As described above, when attempting to separate and peel the semiconductor layer 3 from the substrate 1 to form elements S, the crystal growth layer can be easily separated from the substrate 1 when forming the frangible portion where stress concentrates and causes a crack.

Next, if the aforementioned frangible portion is formed, the GaN is subsequently vapor grown starting at a top surface (front surface) of the frangible portion and, if the frangible portion is not formed, the GaN is subsequently vapor grown starting at the exposed surface E (first surface 1a of the substrate 1) between adjacent masks as described above.

After the crystal growth surface exceeds the upper edge of the first deposition inhibiting mask 2, the semiconductor layer 3 grows in the horizontal direction (the left-right direction in the drawings) along the top surface of the first deposition inhibiting mask 2. Therefore, the semiconductor layer 3 can be configured as a semiconductor crystal layer suitable for use in a laser element or the like where there is little threading dislocation.

Then, the element forming step (first time) is ended before each semiconductor layer 3 that has started to grow from the exposed surfaces E between the masks makes contact with or overlaps an adjacent semiconductor layer 3. This is because, when adjacent semiconductor layers 3 come into contact with each other, crystal defects such as cracks or threading dislocation easily occur at the contact portions of the semiconductor layers 3.

Mask Removing Step (First Time)

When the above-described element forming step (first time) is completed, the substrate 1 is removed from the vapor-phase growth device (epitaxial device) and the first deposition inhibiting mask 2 is removed by using an etchant that does not substantially damage the semiconductor layers 3 that have grown.

For example, in the case of a mask composed of an $SiO_2$ film, HF-based wet etching is performed. By performing etching, each deposition inhibiting mask 2 is removed, and each semiconductor layer 3 has a substantial T-shape in which only a connection portion formed of a thin semiconductor wall or column remains on the exposed surface E between adjacent masks, as illustrated in FIG. 1C. This shape enables easy separation of the semiconductor layer 3.

Element Separating Step (First Time)

The element separating step is a step in which the semiconductor layers 3 are separated from the substrate 1 by using a member (such as a support substrate 6) having, on one surface (bottom surface), an adhesive layer 5 made of solder using a material such as an AuSn-based alloy or a jig, to thereby obtain individual semiconductor elements S.

For example, the support substrate 6 including the adhesive layer 5 on its bottom surface is made to face the surface (first surface 1a) on which the semiconductor layer 3 of the substrate 1 is formed, and the adhesive layer 5 is pressed against the semiconductor layer 3 and heated so as to adhere to the semiconductor layer 3.

Subsequently, the semiconductor layer 3 that has adhered to and become integral with the adhesive layer 5 is subjected to an external force so as to be peeled upward, and the semiconductor layer 3 is pulled up from the first surface 1a of the substrate 1. As a result, the main bodies of the semiconductor elements S can be separated without scratching.

Since each semiconductor layer 3 is fragile and susceptible to stress and is broken and separated by a crack forming in the "thin semiconductor connection portion" described above, as illustrated in the element separating step of FIG. 1D, a portion of the "thin semiconductor connection portion" of each semiconductor layer 3 after separation remains as a "separation trace (mark)" on both the semiconductor layer 3 (semiconductor element S) above and the first surface 1a of the substrate 1 below.

Therefore, when attempting to use the first surface 1a of the substrate 1 on which the aforementioned "separation traces" remain as the first crystal growth region again, the first surface 1a need to be polished and returned to a flat surface.

In contrast, in the method of manufacturing a semiconductor element according to the embodiment, even when manufacturing the semiconductor layer 3 for a second time or subsequent times, the substrate 1 can be used again for manufacturing the semiconductor layer 3 even when finish processing such as polishing is not performed on the substrate 1 and the aforementioned "separation traces" remain on the first surface 1a.

The embodiments illustrated in FIGS. 2A to 2D and FIGS. 3A to 3F correspond to such a method of manufacturing. The element forming step (second time) of FIG. 2B, the mask removing step (second time) of FIG. 2C, and the element separating step (second time) of FIG. 2D in the substrate reusing process after a second deposition inhibiting mask 2 is made are equivalent to the FIG. 1B element forming step, the mask removing step of the first time of FIG. 1C, and the element separating step of the first time of FIG. 1D, respectively, in the method of manufacturing a semiconductor element of the first time. Therefore, only the FIG. 2A mask forming step (second time) and the state immediately prior to the start of the element forming step (second time) of FIG. 2B will be described, and other detailed descriptions will be omitted. Description will similarly be omitted for the mask removing step (N-th time) and the element separating step (N-th time) of the second time of reusing the substrate 1 (manufacture of the semiconductor layer 3 is the third time).

In the method of manufacturing a semiconductor element according to the embodiment illustrated in FIGS. 2A and 1B, after performing the element separating step of the first time of FIG. 1D described above, the second deposition inhibiting mask 2 forms the second deposition inhibiting mask 2 having a pattern shape at a position or in a region different from the formation position of the first deposition inhibiting mask 2 formed in the mask forming step of the first time of FIG. 1A. Thus, this manufacturing method includes the mask reforming step of FIG. 2A, in which a second crystal growth region that is flat as in the mask forming step of the first time of FIG. 1A is exposed as the exposed surface E between mask patterns.

Then, in the element reforming step of FIG. 2B following the mask reforming step of FIG. 2A, a new semiconductor layer 3 can be created starting from the flat exposed surface E without performing a polishing process or the like as described above.

In addition, the mask removing step (process) of FIG. 2C and the element separating step (process) of FIG. 2D are performed on the substrate 1 including the new semiconductor layer 3, similar to the manufacturing of the first time. As a result, semiconductor elements S made of a high-quality semiconductor layer 3, which are equivalent to those obtained in the manufacturing of the first time, can be manufactured repeatedly by using the same substrate 1 without needing to spend time and money on polishing or other processes.

Furthermore, as described above, at the trace at which each semiconductor layer 3 is cut and separated, a portion of the "thin semiconductor connection portion" remains as the "separation trace" in the region where the flat exposed surface E described above was present, and the portion is increased each time the separation is performed. To prevent these remaining "separation traces" from appearing on the exposed surface, the deposition inhibiting mask 2 is formed in the mask reforming step as follows each time the substrate reusing process is performed. The deposition inhibiting mask 2 is formed in a region different from the formation position of the deposition inhibiting mask 2 formed in the mask forming step and the mask reforming step performed before this step (in the region including the exposed surface E (crystal growth region) used until the previous time including an initial time (first time)) while shifting the formation position of the mask. As a result, the new semiconductor layer 3 can be manufactured using the same substrate 1 continuously over a plurality of times without performing polishing or other processes.

In the above embodiment, the pattern of the deposition inhibiting mask 2 has a band or stripe shape as an example. Thus, the number of times the substrate 1 can be reused is limited to several times. However, adopting an aspect of setting and fabricating the mask region to have a two-dimensional matrix pattern such as a lattice-like pattern as the mask pattern makes it possible to further increase the number of times the substrate 1 can be reused.

In addition, to increase the number of times the substrate 1 can be reused, the pattern of the deposition inhibiting mask 2 is preferably such that a flat region on the first surface 1a (the front surface) having no separation traces can be used without waste. Therefore, the exposed surfaces E are preferably not set separately from each other with gaps and continue to be moved to an adjacent region.

Figure 4:
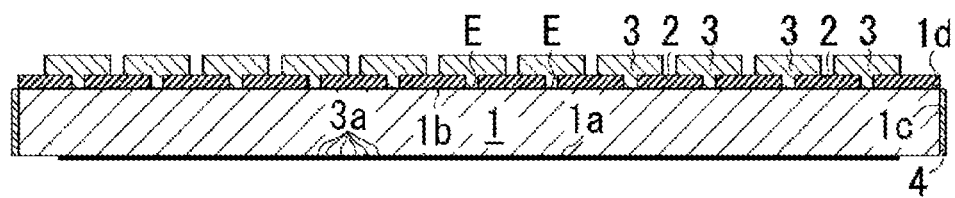
FIG. 4 is a diagram illustrating a state after an element forming step according to another embodiment, in which the substrate is inverted before use.

Furthermore, in the case of the substrate 1 in which the protective layer 4 ($Al_2O_3$ layer) described above is provided on the back surface (second surface 1b) located on a side (bottom side) opposite to the first surface 1a, the exposed surface E may be configured as follows. As illustrated in FIG. 4, the protective layer 4 may be removed, the front and back sides of the substrate 1 may be inverted, and the second surface 1b (back surface), which has no separation traces, may be set as the exposed surface E to serve as the starting point of growth of the semiconductor crystals. Even when this second surface 1b is used, the substrate 1 can be reused a plurality of times, similar to when the first surface 1a is used.

As described above, according to the method of manufacturing a semiconductor element of the embodiment, the substrate for manufacturing the element can be reused a greater number of times by using different mask patterns for different times and combining the mask patterns. As a result, the cost of manufacturing the semiconductor element can be further reduced.

In a case where the semiconductor layer 3 is manufactured using the substrate 1 including the separation traces from the second time onward, a step portion 8 where an unevenness 7 of the separation traces is reverse transferred is formed on the back surface (substrate 1 side) of each separated semiconductor element S, as illustrated in FIG. 2D. These step portions 8 not only prove that the semiconductor elements S were manufactured by the method of manufacturing described above but also have the effect of improving adhesion of each semiconductor element S to a substrate electrode or the like when mounted on another substrate or the like.

As described above, the present disclosure can be embodied in the form of the following aspects.

A method of manufacturing a semiconductor element of the present disclosure includes a mask forming step, an element forming step, a mask removing step, and an element separating step.

The maks forming step is a step of forming, on a first surface of a substrate, a first deposition inhibiting mask configured to inhibit growth of semiconductor crystals in a predetermined pattern to define a front surface region not covered by the first deposition inhibiting mask as a first crystal growth region, the first surface serving as a starting point of growth of the semiconductor crystals.

The element forming step is a step of growing semiconductor crystals by vapor-phase growth from the first crystal growth region over the first deposition inhibiting mask to form a semiconductor layer to serve as an element.

The mask removing step is a step of removing the first deposition inhibiting mask.

The element separating step is a step of separating the semiconductor layer from the substrate.

Then, after the element separating step, a substrate reusing process of using the substrate after separating the semiconductor layer is performed one or more times.

The substrate reusing process includes a mask reforming step, an element reforming step, a mask removing step, and an element separating step.

The mask reforming step is a step of forming a second deposition inhibiting mask in a region including the first crystal growth region and differing from a formation position of the first deposition inhibiting mask formed in the mask forming step to expose a second crystal growth region not covered by the second deposition inhibiting mask.

The element reforming step is a step of growing semiconductor crystals by vapor-phase growth from the second crystal growth region over the second deposition inhibiting mask adjacent to the second crystal growth region to again form a semiconductor layer to serve as an element.

The mask removing step is a step of removing the second deposition inhibiting mask.

The element separating step is a step of separating the semiconductor layer that is formed from the substrate.

According to the method of manufacturing a semiconductor element of the present disclosure, a substrate used for manufacturing elements can be reused without needing to spend time and money on polishing or other processes.

In the method of manufacturing a semiconductor element of the present disclosure, the substrate reusing process may be repeated a plurality of times, and each time the substrate reusing process is performed, in the mask reforming step, a position of the second crystal growth region, which is a starting point of the growth of the semiconductor crystals, may be set to an unused front surface region in the element forming step and the element reforming step.

In the method of manufacturing a semiconductor element of the present disclosure, an edge portion region of the first surface may be covered by a deposition inhibiting mask.

In the method of manufacturing a semiconductor element of the present disclosure, a protective layer configured to suppress substrate alteration may be formed on a second surface located on a side opposite to the first surface.

In the method of manufacturing a semiconductor element of the present disclosure, at least one of the first deposition inhibiting mask and the second deposition inhibiting mask may include a material containing a silicon oxide.

In the method of manufacturing a semiconductor element of the present disclosure, at least one of the first deposition inhibiting mask and the second deposition inhibiting mask may include a material containing at least one element selected from the element group consisting of tungsten, molybdenum, tantalum, and niobium.

A semiconductor element according to the present disclosure may be a semiconductor element formed on a substrate by crystal growth and separated from the substrate, the semiconductor element including a step portion where surface unevenness of the first surface is reversely transferred, on a surface opposing the substrate prior to separation.

A substrate of the present disclosure may include a first surface serving as a starting point of growth of semiconductor crystals, and a protective layer provided on a second surface located on a side opposite to the first surface.

The present disclosure can be implemented in a variety of other forms without departing from the spirit or key characteristics of the present disclosure. Accordingly, the foregoing embodiment is merely illustrative in all respects, and the scope of the present disclosure is as set forth in the claims and is in no way limited by the specification. Furthermore, any variations or modifications that fall within the scope of the claims are also within the scope of the present disclosure.

REFERENCE SIGNS LIST

1 Substrate
1a First surface (front surface)
1b Second surface (back surface)
1c Substrate end surface (side surface)
1d Edge portion
2 Deposition inhibiting mask
3 Semiconductor layer
3a Remaining portion of semiconductor layer
4 Protective layer
7 Unevenness
8 Step portion
E Exposed surface
S Semiconductor element

The invention claimed is:

1. A method of manufacturing a semiconductor element, comprising:
forming, on a first surface of a substrate, a first deposition inhibiting mask configured to inhibit growth of semiconductor crystals in a predetermined pattern to define a front surface region not covered by the first deposition inhibiting mask as a first crystal growth region, the first surface serving as a starting point of growth of the semiconductor crystals;
growing semiconductor crystals by vapor-phase growth from the first crystal growth region over the first deposition inhibiting mask to form a semiconductor layer to serve as an element;
removing the first deposition inhibiting mask; and
separating the semiconductor layer from the substrate,
wherein after the semiconductor layer is separated from the substrate, a substrate reusing process of using the substrate after separating the semiconductor layer is performed one or more times, the substrate reusing process comprising:
forming a second deposition inhibiting mask in a region including the first growth region and differing from a formation position of the first deposition inhibiting mask to expose a second crystal growth region not covered by the second deposition inhibiting mask;
growing semiconductor crystals by vapor-phase growth from the second crystal growth region over the second deposition inhibiting mask adjacent to the second crystal growth region to again form a semiconductor layer to serve as an element;
removing the second deposition inhibiting mask; and
separating the semiconductor layer that is formed from the substrate.

2. The method of manufacturing a semiconductor element according to claim 1, wherein
the substrate reusing process is repeated a plurality of times, and
each time the substrate reusing process is performed, a position of the second crystal growth region, which is a starting point of the growth of the semiconductor crystals, is set to an unused front surface region.

3. The method of manufacturing a semiconductor element according to claim 1, wherein
an edge portion region of the first surface is covered by a deposition inhibiting mask.

4. The method of manufacturing a semiconductor element according to claim 1, wherein
a protective layer configured to suppress substrate alteration is formed on a second surface located on a side opposite to the first surface.

5. The method of manufacturing a semiconductor element according to claim 1, wherein
at least one of the first deposition inhibiting mask and the second deposition inhibiting mask comprises a material containing a silicon oxide.

6. The method of manufacturing a semiconductor element according to claim 1, wherein
at least one of the first deposition inhibiting mask and the second deposition inhibiting mask comprises a material containing at least one element selected from the element group consisting of tungsten, molybdenum, tantalum, and niobium.

7. The method according to claim 1, wherein:
the substrate reusing process is repeated a plurality of times;
each time the substrate reusing process is performed, a position of the second crystal growth region, which is a starting point of the growth of the semiconductor crystals, is set to an unused front surface region; and
an edge portion region of the first surface is covered by a deposition inhibiting mask.

8. The method according to claim 1, wherein:
the substrate reusing process is repeated a plurality of times;
each time the substrate reusing process is performed, a position of the second crystal growth region, which is a starting point of the growth of the semiconductor crystals, is set to an unused front surface region; and
a protective layer configured to suppress substrate alteration is formed on a second surface located on a side opposite to the first surface.

9. The method according to claim 1, wherein:
an edge portion region of the first surface is covered by a deposition inhibiting mask; and
a protective layer configured to suppress substrate alteration is formed on a second surface located on a side opposite to the first surface.

10. The method according to claim 1, wherein:
the substrate reusing process is repeated a plurality of times;
each time the substrate reusing process is performed, a position of the second crystal growth region, which is a starting point of the growth of the semiconductor crystals, is set to an unused front surface region; and
at least one of the first deposition inhibiting mask and the second deposition inhibiting mask comprises a material containing a silicon oxide.

11. The method according to claim 1, wherein:
an edge portion region of the first surface is covered by a deposition inhibiting mask; and
at least one of the first deposition inhibiting mask and the second deposition inhibiting mask comprises a material containing a silicon oxide.

12. The method according to claim 1, wherein:
a protective layer configured to suppress substrate alteration is formed on a second surface located on a side opposite to the first surface; and
at least one of the first deposition inhibiting mask and the second deposition inhibiting mask comprises a material containing a silicon oxide.

13. The method according to claim 1, wherein:
the substrate reusing process is repeated a plurality of times;
each time the substrate reusing process is performed, a position of the second crystal growth region, which is a starting point of the growth of the semiconductor crystals, is set to an unused front surface region; and
at least one of the first deposition inhibiting mask and the second deposition inhibiting mask comprises a material containing at least one element selected from the element group consisting of tungsten, molybdenum, tantalum, and niobium.

14. The method according to claim 1, wherein:
an edge portion region of the first surface is covered by a deposition inhibiting mask; and
at least one of the first deposition inhibiting mask and the second deposition inhibiting mask comprises a material containing at least one element selected from the element group consisting of tungsten, molybdenum, tantalum, and niobium.

15. The method according to claim 1, wherein:
a protective layer configured to suppress substrate alteration is formed on a second surface located on a side opposite to the first surface; and
at least one of the first deposition inhibiting mask and the second deposition inhibiting mask comprises a material containing at least one element selected from the element group consisting of tungsten, molybdenum, tantalum, and niobium.

\* \* \* \* \*